(12) United States Patent
Liu et al.

(10) Patent No.: US 6,919,627 B2
(45) Date of Patent: Jul. 19, 2005

(54) MULTICHIP MODULE (75) Inventors: Chung-Lun Liu, Taichung Hsien (TW); Chin-Huang Chang, Taichung Hsien (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 35 days.

(21) Appl. No.: 10/454,158

(22) Filed: Jun. 3, 2003

(65) Prior Publication Data

US 2004/0084760 A1 May 6, 2004

(30) Foreign Application Priority Data

Jun. 4, 2002 (TW) ......................................... 91111933 A (51) Int. Cl.⁷ .......................... H01L 23/02; H01L 23/34
(52) U.S. Cl. ...................... 257/686; 257/685; 257/777; 257/723; 257/787; 257/789; 257/795
(58) Field of Search ................................ 257/685, 686, 257/777, 784, 723, 676, 690, 787, 788, 789, 795

(56) References Cited

U.S. PATENT DOCUMENTS

| | | | |
|---|---|---|---|
| 5,323,060 A | | 6/1994 | Fogal et al. |
| 6,005,778 A | | 12/1999 | Spielberger et al. |
| 6,388,313 B1 | | 5/2002 | Lee et al. |
| 2003/0054162 A1 | * | 3/2003 | Watson |
| 2003/0141582 A1 | * | 7/2003 | Yang et al. |

* cited by examiner

Primary Examiner—Wael Fahmy
Assistant Examiner—DiLinh Nguyen
(74) Attorney, Agent, or Firm—Mikio Ishimaru (57) ABSTRACT A multi-chip module is proposed, which is designed to pack two or more semi-conductor chips in a stacked manner over a chip carrier in a single package. The multi-chip module is characterized by the use of adhesive with fillers to allow the topmost chip (i.e. the second chip) superimposed to the bottommost chip (i.e. the first chip) after the first chip electrically connected to the chip carrier. The thickness of the adhesive layer depends on the diameter of the fillers higher than loop height of the bonding wires that is positioned above the active surface of the first chip to prevent the bonding wires connected to the first chip to come in contact with the overlaid chip.

14 Claims, 7 Drawing Sheets

MULTICHIP MODULE

FIELD OF THE INVENTION

The present invention relates to multichip modules (MCM) and a manufacturing method thereof, and more particularly to a multichip module having more than two chips disposed on a chip carrier in a stacked manner and a manufacturing method thereof.

BACKGROUND OF THE INVENTION

With increasing demands for higher electronic performances and miniaturization, multichip module arrangement has become a trend. Multichip module is an apparatus having at least 2 chips adhered onto a single chip carrier such as a substrate or a leadframe. The chip-to-chip carrier bonding manner can be generally categorized into two: One method is by spacing chips next to each other on a chip carrier. This bonding method essentially would not increase the overall height of the semiconductor package, but the chip carrier must contain a large area of die attachment area as to accommodate the required chip numbers. This increased chip carrier surface will generate a higher thermal stress, and therefore resulting in a warpage of the chip carrier and subsequently an occurrence of delamination at the interface between the chip and the chip carrier, making this method facing much more reliability concerns. The other method is by adhering chips in a perpendicularly stacked manner. Although this method would increase the overall height of the semiconductor package, it is widely used by most semiconductor manufacturers because this method avoids the chip carrier to be oversized and therefore eliminates the occurrence of warpage or delamination.

Figure 8:
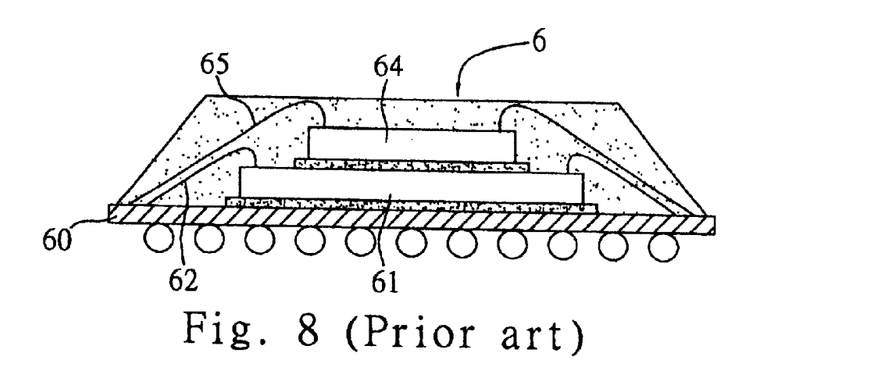
FIG. 8 (PRIOR ART) is a cross-sectional view showing a conventional stacked semiconductor package.

A stacked multichip module is commonly structured as shown in FIG. 8, in which the stacked multichip module 6 has a first chip 61 adhered to a substrate 60, a second chip 64 adhered to the first chip 61, and electrically connecting the first chip 61 and the second chip 64 to the substrate 60 via first gold wires 62 and second gold wires 65 respectively. In addition, the second chip 64 has to be smaller in size than that of the first chip 61, as to avoid the second chip 64 making any contact or impeding the bonding between the first gold wires 62 and the first chip 61. In such a case, the top-most chip would have the smallest size, that is, the surface for disposing electronic circuits and electronic elements is reduced, which is disadvantageous for developing high-density integrated circuits.

Figure 9:
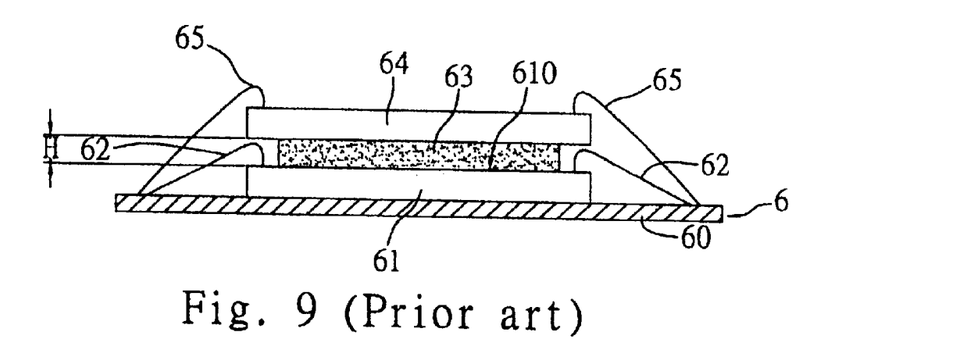
FIG. 9 (PRIOR ART) is a cross-sectional view showing a conventional multichip module disclosed by U.S. Pat. No. 5,323,060.

In order to avoid the foregoing semiconductor package being restricted to the size and not able to achieve high density integration, U.S. Pat. No. 5,323,060 entitled "Multichip Module Having A Stacked Chip Arrangement" and U.S. Pat. No. 6,005,778 entitled "Chip Stacking and Capacitor Mounting Arrangement Including Spacers" discloses a semiconductor package having an outermost chip extending outwardly to solve this problem. As shown in FIG. 9, the semiconductor package 6 is provided as follows: a first chip 61 being adhered and electrically connected to the substrate 60 via first bonding wires 62; adhering an insulator apparatus 63 of predetermined thickness to the active surface 610 of the first chip 61 whereon bonding pads are not disposed. The insulator apparatus 63 can be an insulated tape, a dummy die that do not perform electrical factions or using a silicon member, however the height H of the insulator apparatus 63 must be larger than the loop height of the first bonding wires 62, which is defined by the maximum distance between the active surface 610 of the first chip 61 and the vertexes of the outwardly projecting loops of the bonding wires, so as to avoid the second chip 64 in contact with the first bonding wires 62 when placing onto the insulator apparatus 63, which would otherwise cause shortage.

The insulator apparatus 63 provides clearance larger than the loop height of the first bonding wires 62 between the bottommost chip and the superimposed topmost chip, so as to prevent the second chip 64 making contact with the first bonding wires even extending outwardly atop of the bonding loop and eliminate shortage from occurrence. In this case, the size of the second chip 64 is not necessary be restricted and the size larger than the first chip 61 is also applicable to use, therefore largely improving the capability of forming integrated circuits with higher density.

Figure 10:
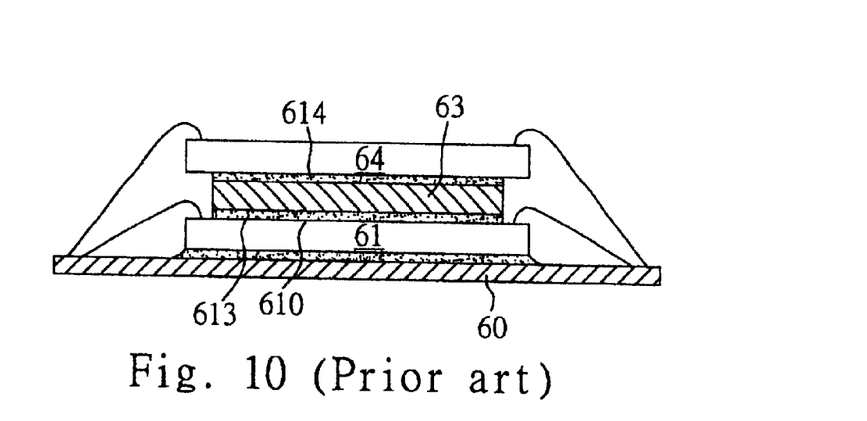
FIG. 10 (PRIOR ART) is a cross-sectional view showing a conventional multichip module disclosed by U.S. Pat. No. 6,005,778.

However, when using insulated tapes made by adhesive materials such as polyimide for adhering the second chip 64, because of the high fluidity the planarity of the second chip 64 is difficult to achieve. Moreover, because of the Coefficient of Thermal Expansion (CTE) differences between the adhesive materials and the chip is great, during temperature cycles of the latter procedures the chip bonding surface may be easily suffered from warpage, delamination or even chip cracking. Thus, as to solve this problem, the manufacturers developed a so-called dummy die, which does not perform electrical functions, or a stacked semiconductor package having an insulator apparatus made by silicon, the same materials as the chip. The manufacturing steps of this package are illustrated as follows: firstly, preparing a chip carrier 60 whereon a first chip is adhered, and applying a first adhesive layer 613 on the active surface 610 of the first chip 61; then after adhering and curing an insulator apparatus 63 of a predetermined height to the first adhesive layer 613, a wire bonding process is carried out to electrically connect the first chip 61 to the chip carrier 60; following that, a second chip 64 is adhered to the insulator apparatus 63 via the second adhesive layer 614 applied previously on the insulator apparatus 63, and after curing and wire bonding process the second chip 64 is also electrically connected to the chip carrier 60 to form a multi-chip stacked semiconductor package 6.

The foregoing method although can successfully overcome the problem of differences in CTE between the chip and the insulator apparatus, this method is costly and the manufacturing procedures is complex and prolonged, making the final yield difficult to enhanced. Moreover, as adhesives of high fluidity is required to be applied over the active surface of the first chip or the surface of the insulator apparatus prior to bonding between the insulator apparatus and the topmost chip (i.e. the second chip), it is common that the adhesives would lead to the deviation of the insulator or the topmost chip or even damage the first chip pads. As such, the functionality and chip bonding reliability concerns for the packaged product still exist.

Figure 11:
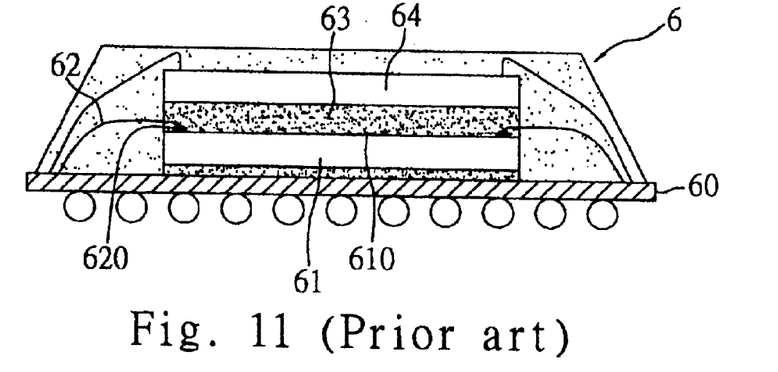
FIG. 11 (PRIOR ART) is a cross-sectional view showing a conventional multichip module disclosed by U.S. Pat. No. 6,388,313.

In order to solve the foregoing problem, U.S. Pat. No. 6,388,313 discloses a stacked multichip semiconductor packaging method in which a portion of a first bonding wires is directly embedded into an adhesive, so as to prevent the second chip placed on the adhesive from contacting with gold wires. As shown in FIG. 11, this method is substantially very similar to the foregoing method using an adhesive as an insulator apparatus. Firstly, forming a plurality of studs on the active surface 610 of a first chip 61 at positions opposing to the bonding pads and using reverse bonding techniques to bond the other ends of the first bonding wires 62 where one end is adhered to a chip carrier, to the corresponding stud points. Then using print screening methods to apply an adhesive 63 on the active surface 610 of the first chip 61 until a desired thickness is achieved allowing the first bonding wires 62 positioned above the first chip 61, to be completely embedded inside the adhesive 63. It is then followed by pressing the second chip 64 against the adhesive layer 63 and then the chip stacking method is accomplished.

This packaging method utilizes reverse bonding technique to reduce the loop height to about 2 mils, and then applying an adhesive to encapsulate parts of the wire loops. As the adhesive layer is thickened only a little to avoid the second chip from contacting with gold wires, the overall height of the packaged product can be greatly reduced. However, one drawback is that for to the above-mentioned reverse bonding technique, the formation of a plurality of studs on the first chip for wire bonding is required prior to reverse bonding, making the procedures longer and costly. In addition, as the Coefficient of Thermal Expansion (CTE) between the adhesive and the gold wires is great, the gold wires embedded in the adhesive may be easily broken due to different thermal stress under thermal cycles at latter procedures and as a result, the electronic performances of gold wires may be seriously impaired. Besides, during bonding of the second chip, a highly accurate control equipment must be additionally incorporated to accurately control the bond force of the second chip against the adhesive layer, which further increases the overall manufacturing cost.

SUMMARY OF THE INVENTION

A primary objective of the present invention is to provide a multichip module and a manufacturing method thereof, which simplifies and reduces the time for the manufacturing procedures as well as reducing the overall manufacturing cost. Another objective of the present invention is to provide a multichip module and a manufacturing method thereof, in which the differences in coefficient of thermal expansion between the topmost, bottommost chip and that of the adhesive layer interposed in between are greatly reduced, so as to prevent delamination at the chip bonding surface, chip cracking or broken wires from accordance, and ultimately enhancing the yield for the packaged product. Further, another objective of the present invention is to provide a multichip module and a manufacturing method thereof in which the heat dissipating efficiency of the topmost and bottommost chip is enhanced, thereby solving the heat retaining problem. Yet another objective of the present invention is to provide a multichip module and a manufacturing method thereof, in which the fluidity of the adhesive is reduced, allowing a preferred planarity of the topmost chip adhered onto the adhesive layer to be maintained. Yet another objective of the present invention is to provide a multichip module and a manufacturing method thereof, in which the chips have not size limitation. Further another objective of the present invention is to provide a multichip module and a manufacturing method thereof, in which the thickness of the adhesive layer interposed can be reduced, thereby reducing the overall height of the packaged product. Further, another objective of the present invention is to provide a multichip module and a manufacturing method thereof, in which a method is proposed such that the topmost chip cannot make contact with the bottommost chip, thereby eliminating the occurrence of broken wires and shortage.

According to the above and other objectives, a multichip module is proposed, comprising: a chip carrier; at least one first chip having an active surface and an opposing non-active surface, allowing the first chip to be adhered to the chip carrier via the non-active surface; a plurality of first bonding wires which one end thereof is bonded to the active surface of the first chip and the other end is bonded to the chip carrier for providing electrical connection between the first chip and the chip carrier; at least one second chip having an active surface and an opposing non-active surface; an adhesive layer applied over the active surface of the first chip, containing a plurality of fillers therein in which the diameter of the fillers determines the thickness of the adhesive layer which is made just higher than the loop height of the bonding wires after adhering the second chip to the first chip via the non-active surface of the second chip; a plurality of second bonding wires for providing electrical connection between the second chip and the chip carrier; and an encapsulant for encapsulating the first chip, the first bonding wires, the second chip and the second bonding wires.

A manufacturing method for a multichip module is proposed, comprising the steps as follows: adhering at least one first chip having an active surface and a non-active surface to a chip carrier; using a plurality of first bonding wires to electrically connect the active surface of the first chip to the chip carrier; applying an adhesive over the active surface of the first chip, in which the adhesive contains a plurality of fillers having a predetermined diameter for determining the thickness of the adhesive; adhering at least one second chip to the first chip via the adhesive, in which the adhesive layer formed between the first chip and the second chip must be larger than the loop height of the first bonding wires; using a plurality of second bonding wires to electrically connect the second chip to the chip carrier; and molding and other latter procedures.

In another embodiment of the present invention, a third chip is further adhered onto the second chip to form a stacked multichip module with three chips stacked on top of each other. Because the diameter of the fillers contained in the adhesive is larger than the loop height, the size of the third chip is not restricted because contact is not made between the third chip and the gold wires, allowing more same sized chips to be received in a same semiconductor package.

Yet, in another embodiment of the present invention, reverse bonding technique is utilized to substantially reduce the loop height of the first bonding wires, allowing fillers with smaller diameters to be used, so as to reduce the thickness of the adhesive, and thereby achieving the objective of reducing the overall height of a semiconductor package.

The present invention solve those drawbacks from the prior arts by mixing a plurality of fillers into a dielectric or conductive adhesive and the diameter of the filler determines the thickness of the adhesive layer between the topmost and bottommost chip. Fillers with an appropriate diameter are chosen depending on the loop height of the first bonding wires (i.e. the distance between the active surface of the chip and the vertexes of the outwardly projecting loops of the bonding wires). When using conventional wire bonding technique, the loop height is high (approx. 4 mils) therefore fillers with larger diameter should be chosen, while when using reverse bonding technique, the loop height is low (approx. 2 mils) therefore filler with smaller diameter should be chosen. However the diameter of the fillers must be smaller than the loop height of the first bonding wires, so as to prevent contact between the second chip and the first bonding wires causing shortage.

The fillers can be made by dielectric polyimide, copper, aluminum, other alloys or other stiff and conductive materials. Addition of fillers into adhesive could change the characteristics of the adhesive, which in turn reducing the coefficient of thermal expansion of the adhesive thereby reducing thermal stress difference between the adhesive, chip and bonding wires, preventing the wire bonding surface from delamination, chip cracking or even broken wires. Moreover, addition of solid fillers into adhesive can effectively reduce the fluidity of the adhesive, which in tern preventing deviation of the second chip after mounting on the adhesive layer, and thereby a preferred planarity can be achieved. Fillers made by metal materials could also enhance the heat dissipation of the chip, thereby solving heat-retaining problem for the stacked multichip structure.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF THE PREFERRED EMBODIMENTS

A multichip module and a manufacturing method thereof proposed in the present invention are fully described in the following embodiments with reference to FIGS. 1-7. It should be understood that, the drawings in the preferred embodiments are only made in simplicity for only illustrating elements relevant to the invention. The drawings are simplified and are not drawn to scale from the substantial multichip module proposed in the present invention. The multichip module of the present invention is practically more complex in structure.

First Preferred Embodiment

Figure 1:
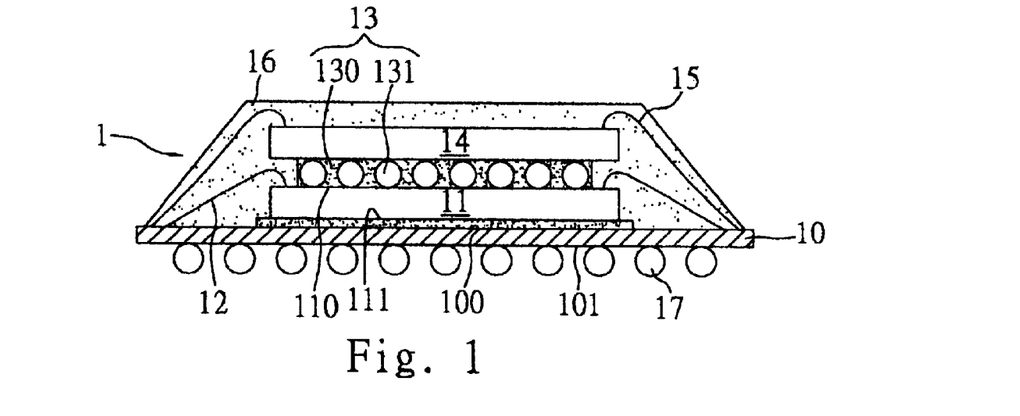
FIG. 1 is a cross-sectional view showing a multichip module in the first embodiment of the present invention.

Illustrated in FIG. 1 is a cross-sectional schematic view of a multichip module according to a first embodiment of the present invention. As shown in the diagram, the semiconductor package 1 comprises: a substrate 10; a first chip 11 adhered onto the substrate 10; a plurality of gold wires 12 for providing electrical connection between the substrate 10 and the first chip 11; an adhesive layer 13 applied over the first chip 11; a second chip 14 adhered to the adhesive layer 13; a plurality of second gold wires 15 for providing electrical connection between the second chip 14 and the substrate; and an encapsulant 16 for encapsulating the first chip 11, the first gold wires 12, the second chips 14 and the second gold wires 15.

The substrate 10 is commonly used as a duel-chip stack substrate or multi-chip stack substrate, which is made by forming a core layer made of materials such as resin, ceramic, or fiberglass and forming conductive trace pattern on the upper and lower surface of the core layer by etching using a copper foil. The substrate 10 has a top surface 100 having a plurality of chip attachment and wire bonding regions, and an opposing bottom surface 101 on which a plurality of solder balls are mounted in an array for electrically connecting the first chip 11 and the second chip 14 to external electronic devices via the solder balls 17.

The first chip 11, having an active surface 110 and an opposing non-active surface 111, is adhered to a predetermined position on the top surface 100 of the substrate 10 via the use of silver paste or polyimide tape. A plurality of bonding pads (not shown) are formed on one or both side or at the periphery of the active surface 110 of the first chip for forming interconnection between the first gold wires 12 and the first chip 11 after die bonding of the first chip 11 to the substrate 10.

Figure 2:
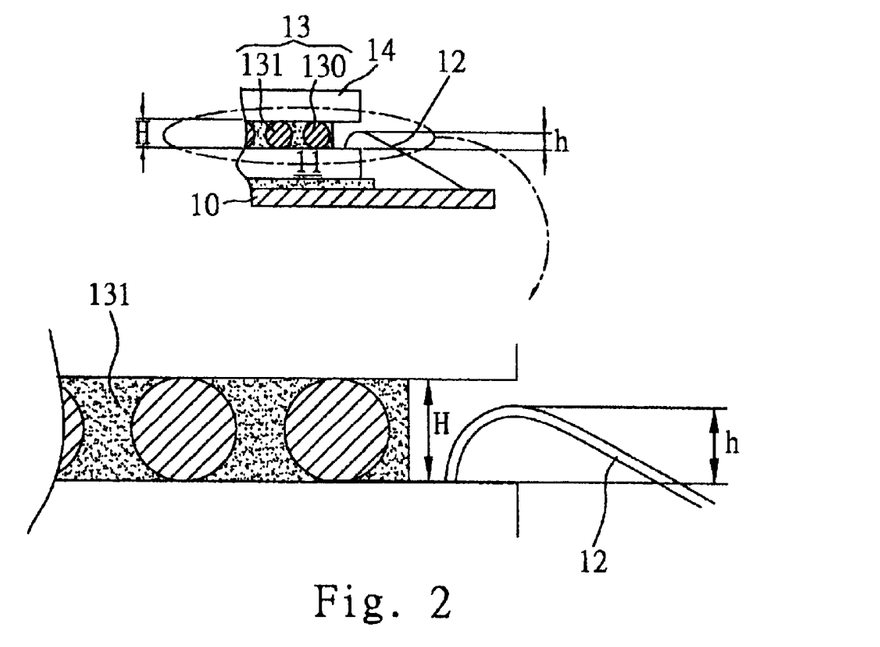
FIG. 2 is a partial magnified schematic diagram showing the magnified adhesive layer and the first gold wire loop of the multichip module of the invention after wire bonding and adhesive dispensing.

After wire bonding of the first gold wires 12, an adhesive 13 is applied over the rest of the active surface 110 of the first chip 11 where bonding pads are not occupied thereon. The adhesive 13 is a composite consisting of an adhesive-like substrate 130 made of dielectric materials such as polyimide or epoxy resin, or conductive materials, mixed with a plurality of fillers 131 therein where the diameter of the fillers therein determines the thickness of the adhesive 13. Referring to FIG. 2, the thickness of the adhesive applied depends on the diameter (H) of the fillers suspended therein, which is approx. between 1 to 8 mils, preferably 5 mils. The diameter (H) of the fillers 131 must be larger than the loop height (h) defined by the distance between the active surface 111 of the first chip 11 and the vertexes of the outwardly projecting loops of the gold wires 12, so as to prevent the second chip 14 making contact with the first gold wires 12 when the second chip 13 is pressed against the adhesive 13, thereby preventing short-circuits from occurring.

The fillers in the adhesive 13 can be made using high molecular polymers or metal materials such as copper, aluminum or copper alloys (for example CuW) or aluminum alloys (for example AlN), or other conductive materials having high rigidity such as carbon silicon compound or silicon particles. After grinding the surface of the conductive fillers, the conductive fillers with a desired diameter are further encapsulated with a dielectric thin layer, so as to prevent dispended fillers 131 making contact with the gold wires or the chip. One advantage is that the addition of fillers into the adhesive 130 made by materials of high coefficient of thermal expansion such as epoxy resin or polymide reduces the resulting coefficient of thermal expansion of the adhesive layer 13, thereby reducing the thermal stress differences between the adhesive 13 and the chip 11 and 14, which ultimately prevents chip cracking and delamination at the chip bonding surface from occurring. Moreover, the fillers made by metal materials such as copper and aluminum provide good conductivity for the adhesive 13 by means of rapid conduction of heat generated from the first chip 11 and the second chip 14 to external surroundings, and thereby solving a heat retaining problem with a stacked multichip module.

In addition, because the diameter of the fillers is only required to be just higher than the loop height of the first gold wires 12 to prevent the second chip 14 from making contact with the first gold wires 12, the manufacturer can effectively control the thickness of the adhesive layer 13 so the overall semiconductor package 1 formed after adhesion of the second chip 14 to the first chip for the invention is lower in height, as compared to the foregoing semiconductor package disclosed by U.S. Pat. No. 5,323,060, which further conforms to the trend of low-profiled semiconductor package. Also, the addition of fillers into the adhesive substrate 130 reduced the fluidity for the adhesive 13, allowing a preferred planarity to be maintained after the second chip 14 is firmly pressed against the adhesive and preventing problems such as chip movement or adhesive leakage.

After the second chip 14 is adhered to the adhesive 13, the second chip 14 is then electrically connected to the substrate 10 via a plurality of gold wires 15. Since the thickness of the adhesive layer 13 dispensed between the first chip 11 and the second chip 14 is a predetermined height higher than the loop height of the first gold wires 12, this prevents the second chip 14 from coming into in contact with the first gold wires 12 even if the second chip is right positioned above the first gold wires 1. This provides more options for different chip types and chip sizes for the second chip 14.

Figure 3A:
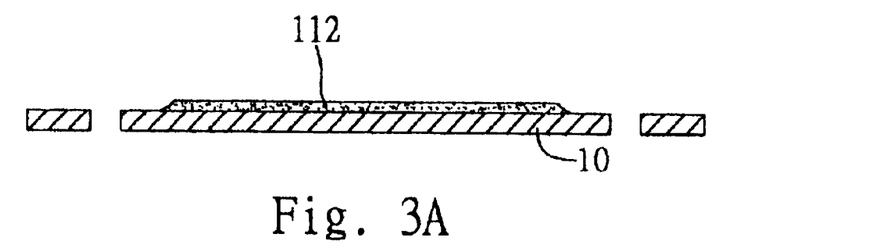
FIGS. 3A-3F is a manufacturing flow diagram of the multichip module in the first embodiment of the invention.
Figure 3B:
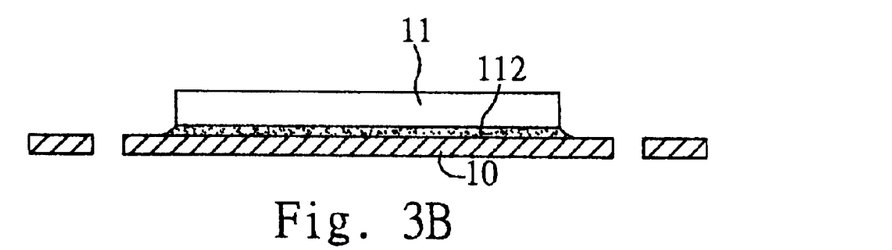

A method for manufacturing the multichip module proposed in the present invention is described with reference to FIGS. 3A to 3F. Referring to FIGS. 3A and 3B, the first step is to prepare a substrate 10 having a predetermined chip attachment region and then dispensing silver paste on the chip attachment region using conventional stamping or globing technique allowing the first chip 11 to be adhered thereon.

Figure 3C:
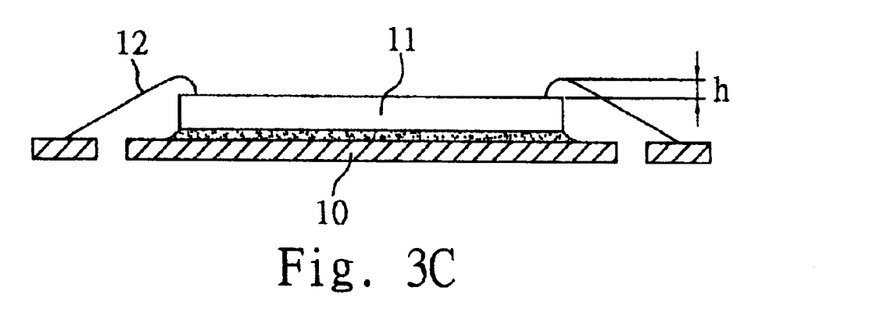

Referring to FIG. 3C, a conventional wire bonding process is performed for electrically connecting the first chip 11 to the substrate 10, which is illustrated as follows: after die bond curing process is completed, a bonder is used to melt and bond one end of the first gold wires 12 to the bonding pads (not shown) of the active surface 110 of the first chip 11, and then the first gold wires 12 are pulled upwardly and bonded to the fingers of the substrate 10, forming a loop height (h), defined as the height of a portion of gold wires 12 higher than the active surface 110 of the first chip 11.

Figure 3D:
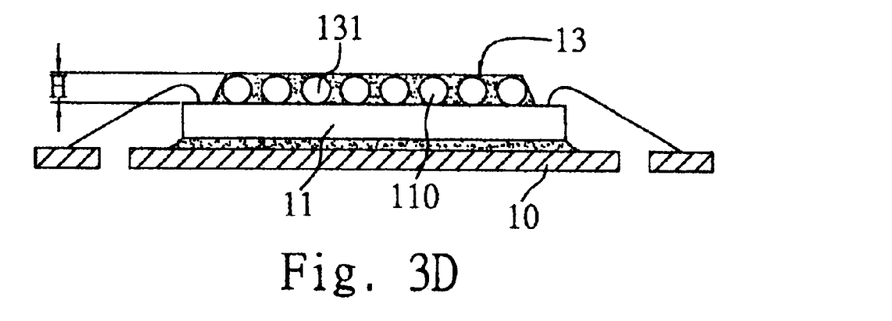

Referring further to FIG. 3D, a print screening method or other adhesive dispensing method is performed in which an adhesive 13 with a plurality of fillers 131 of predetermined diameter is applied over the active surface 110 of the first chip 11. The thickness (H) of the applied adhesive 13 depends on the diameter of the fillers 131 therein, which must be larger than the loop height of the first bonding wires as indicated as loop height (h) in FIG. 3C.

Figure 3E:
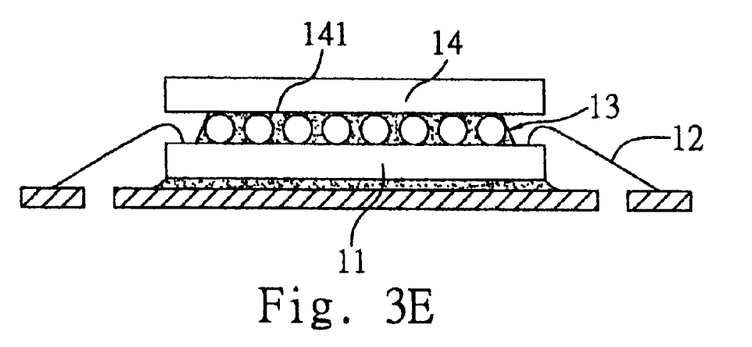

Then, referring to FIG. 3E a chip bonding process is followed, allowing the second chip 14 to be pressed against the adhesive 13 via the non-active surface 141. Since the diameter of the fillers 131 in the adhesive 13 is larger than the loop height of the first bonding wires 12, when a machine (not shown) is implemented for firmly pressing the second chip 14 against the adhesive layer 13, bond force for the chip is not required to be accurately controlled as inappropriate electrical connection between the second chip 15 and the first bonding wires 12 is prohibited, and as a result the manufacturing time and costs can be effectively reduced.

Figure 3F:
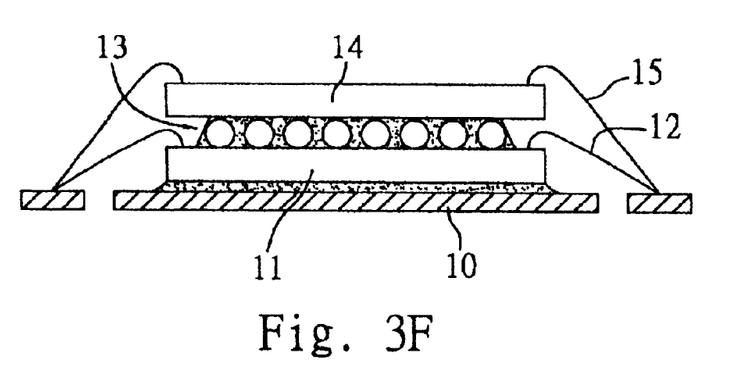

Also, as illustrated in FIG. 3F, the second chip 14 is electrically connected to the substrate 10 using the foregoing wire bonding method. After bonding of the bonding wires 15 for electrically connecting the second chip 14 to the substrate, the entire structure formed by the first chip 11, the adhesive layer 13, the second chip 14 and the substrate 10 is then placed into an encapsulant molding equipment for performing a molding process to form an encapsulant (as indicated as 16 in FIG. 1) that completely encapsulates the first chip 11, the first bonding wires 12, the second chip 14 and the second bonding wires 15, and a completed multichip semiconductor package 1 of the invention is formed.

Second Preferred Embodiment

Figure 4:
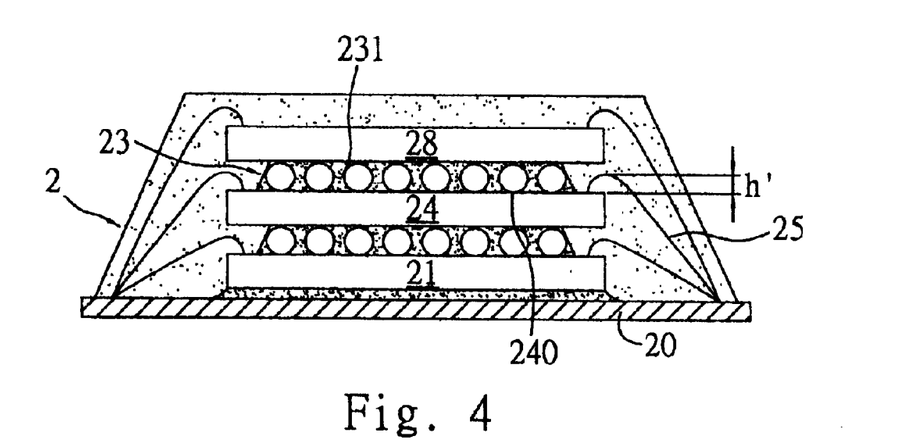
FIG. 4 is a cross-sectional view of the multichip module in the second embodiment of the invention.

Illustrated in FIG. 4 is a cross-sectional schematic view of a multichip module according to a second embodiment of the present invention. As shown in the drawing, a multichip semiconductor package 2 of the second preferred embodiment is structurally similar to that of the foregoing first preferred embodiment, with the only difference in that, after wire bonding of the second bonding wires 25, an adhesive 23 is further applied over the active surface 240 of the second chip 24 whereon bonding pads are not disposed. This adhesive layer 23 is used for adhering at least one third chip 28 above the second chip to form a multichip semiconductor module 2 with three chips stacked perpendicularly on a substrate 20. The adhesive 23 applied on the second chip 24 also contains a plurality of fillers 231 of predetermined diameter as such, the diameter of the fillers 231 must be larger than the loop height (h') of the second bonding wires 25. Thus, like the foregoing second chip 24, the size of a third chip 28 is not restricted, that is, when choosing a third chip 28, a semiconductor chip that is larger in size than the first or second chip 21, 24 can also be used, without the concerns that the third chip 28 would interfere with the second bonding wires 25.

Third Preferred Embodiment

Figure 5:
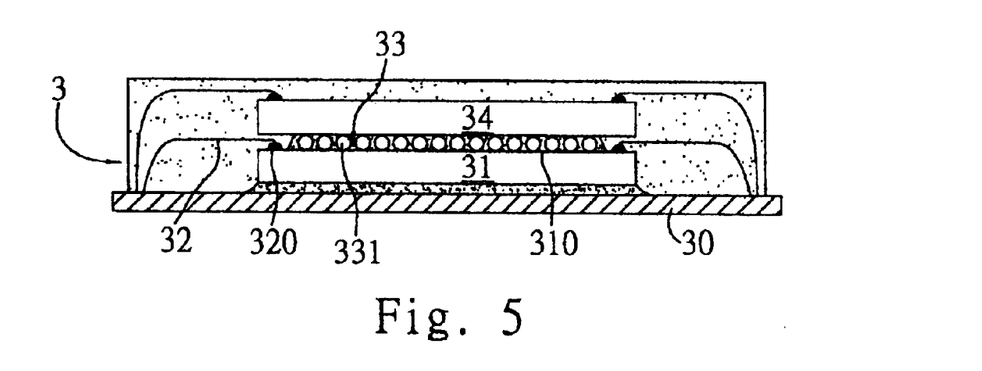
FIG. 5 is a cross-sectional view of the multichip module in the third embodiment of the invention.

Illustrated in FIG. 5 is a cross-sectional schematic view of a multichip module according to a third embodiment of the present invention. As shown in the drawing, a multichip semiconductor package 3 of the third preferred embodiment is structurally similar to that of the foregoing first preferred embodiment, with the only difference in that, the wire bonding manner for the first bonding wires 32 is by utilizing reverse bonding technique; that is forming studs on each of the bonding pads disposed on the active surface 310 of the first chip 31 and bonding one end of the first gold wires 32 to the bonding pads (not shown) on the substrate 30 and then pulling each gold wires 32 upwardly allowing the other end thereof to be stitch bonded to the studs 320. With the use of reverse bonding technique, the wire loops can be modified, allowing the loop height above the first chip 31 to become very small (approx. under 2 mils). Thus, fillers 331 of smaller diameter can be used, so as to reduce the thinness of the adhesive layer 33, which further reducing the overall height of the packaged multichip module 3.

Forth Preferred Embodiment

Figure 6:
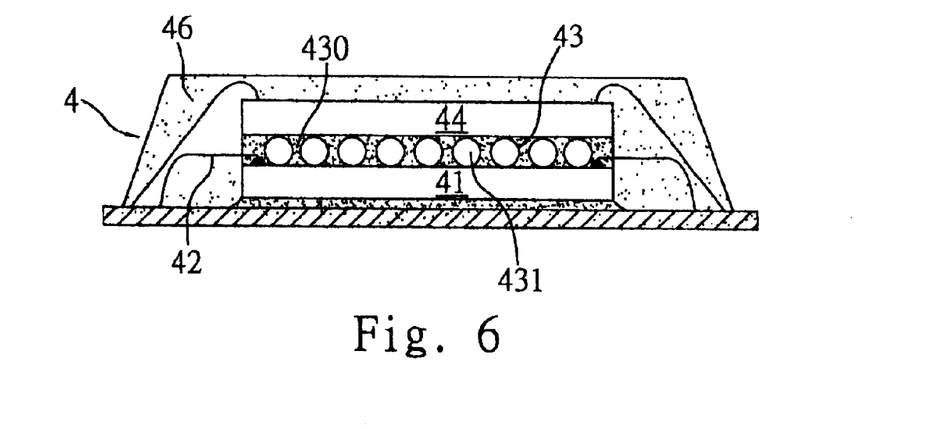
FIG. 6 is a cross-sectional view of the multichip module in the forth embodiment of the invention.

Illustrated in FIG. 6 is a cross-sectional schematic view of a multichip module according to a forth embodiment of the present invention. As shown in the drawing, a multichip semiconductor package 4 of the forth preferred embodiment is structurally similar to that of the foregoing first preferred embodiment, with the only difference in that, between the first chip 41 and the second chip 44 is filled entirely with the adhesive 43, including the part of the gold wires 42 above the first chip 41 is also completely encapsulated therein, however in order to avoid the adhesive layer 43 become too thick, reverse bonding technique is applied for bonding the first gold wires of the multichip semiconductor package 4 in the present embodiment. Moreover, as the adhesive 43 is consisted of dielectric substrate 430 and fillers 431 made by dielectric high molecular polymers, or made by metal materials that have a thin dielectric layer applied on the surface, the occurrence of shortage cannot be made possible, even with the gold wires 42 encapsulated within the adhesive 43 making contact with the suspended fillers 431. In addition, as the adhesive 43 is fully filled between the first chip 41 and the second chip 44 without any gaps present therein, the formation of voids between the first chip 41 and the second chip 44 can be prevented from occurrence, which in turn eliminating the occurrence of popcorn effect for the multichip semiconductor package 4 during the latter high temperature manufacturing processes, and as a result the reliability of the packaged semiconductor product is assured.

Fifth Preferred Embodiment

Figure 7:
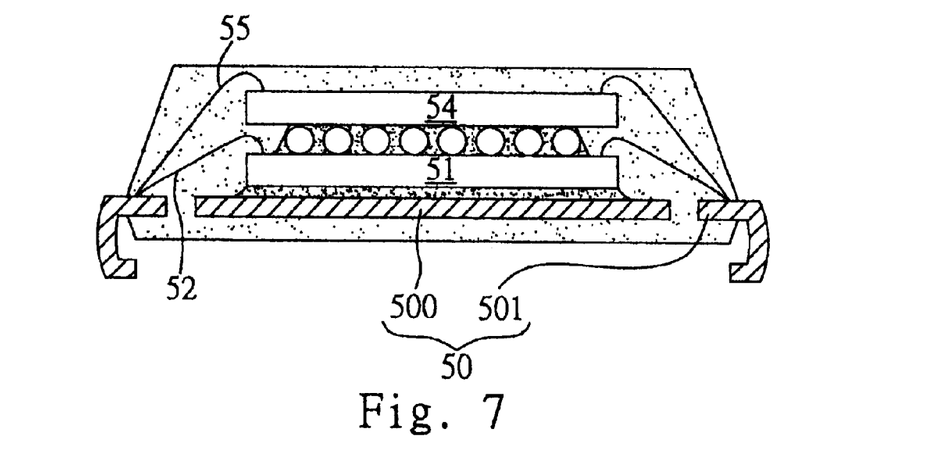
FIG. 7 is a cross-sectional view of the multichip module in the fifth embodiment of the invention.

Illustrated in FIG. 7 is a cross-sectional schematic view of a multichip module according to a fifth embodiment of the present invention. As shown in the drawing, a multichip semiconductor 5 of the fifth preferred embodiment is structurally similar to that of the foregoing first preferred embodiment, with the only difference in that, the first chip 51 is adhered onto a chip pad 500 of a leadframe 50, thus both one ends of first gold wires 52 and second god wires 55 are bonded to the lead fingers 501 of the leadframe 50 at the periphery of the chip pad 500 for eclectically connecting the first chip 51 and the second chip 54 to external surroundings.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multichip module, comprising:

a chip carrier;

at least one first chip having an active surface and an opposing non-active surface to which the chip carrier is adhered;

a plurality of first bonding wires with one end bonded to the active surface of the first chip and the other end bonded to the chip carrier for electrically connecting the first chip with the chip carrier;

at least one second chip having an active surface and an opposing non-active surface;

an adhesive layer, applied on the active surface of the first chip, the adhesive layer comprising a plurality of fillers each having a diameter larger than a loop height of each of the first bonding wires and connecting the second chip to the first chip via the non-active surface of the second chip;

a plurality of second bonding wires, for electrically connecting the second chip with the chip carrier; and an encapsulant, for encapsulating the first chip, the first bonding wires, the second chip and the second bonding wires.

2. The multichip module of claim 1, wherein the multichip module is a stacked semiconductor package.

3. The multichip module of claim 1, wherein the chip carrier is a substrate.

4. The multichip module of claim 1, wherein the chip carrier is a leadframe.

5. The multichip module of claim 1, wherein the first bonding wires are gold wires.

6. The multichip module of claim 1, wherein the adhesive layer is formed with a plurality of fillers mixing evenly within an adhesive substrate.

7. The multichip module of claim 6, wherein the adhesive substrate is a dielectric adhesive.

8. The multichip module of claim 6, wherein the adhesive substrate is a conductive adhesive.

9. The multichip module of claim 6, wherein the adhesive substrate is made of a material selected from a group consisting of epoxy resin and polyimide.

10. The multichip module of claim 6, wherein the fillers are made of a material selected from copper, aluminum, copper alloys, aluminum alloys, carbon silicon compound and silicon.

11. The multichip module of claim 6, wherein the fillers are made of a dielectric material of high molecular polymers.

12. The multichip module of claim 6, wherein the fillers are made of a conductive and rigid material.

13. The multichip module of claim 1, wherein the thickness of the adhesive layer is determined by the diameter of the fillers.

14. The multichip module of claim 1, wherein the loop height of the first bonding wires is defined by the distance between the active surface of the first chip and the vertexes of the outwardly projecting loops of the first bonding wires.

* * * * *

UNITED STATES PATENT AND TRADEMARK OFFICE
CERTIFICATE OF CORRECTION

PATENT NO.   : 6,919,627 B2
DATED        : July 19, 2005
INVENTOR(S)  : Liu et al.

It is certified that error appears in the above-identified patent and that said Letters Patent is hereby corrected as shown below:

Column 1,
Line 14, delete "module arrangement has" and insert therefor -- modules have --.
Line 14, delete "Multichip" and insert therefor -- A multichip --.
Line 15, delete "an apparatus" and insert therefor -- a module --.
Line 18, delete "two:" and insert therefor -- two methods. --.
Line 22, after "1arge" delete "area of".
Line 23, delete "chip numbers" and insert therefor -- number of chips --.
Line 25, delete "resulting" and insert therefor -- result --.
Line 25, delete "carrier and subsequently an occurrence" and insert therefor -- carrier. This increases the possibility --.
Line 27, after "making" delete "this method facing much more".
Line 28, delete "concerns" and insert therefor -- more of a concern --.
Line 30, delete "would increase" and insert therefor -- increases --.
Line 33, before "oversized" delete "the chip carrier to be".
Line 33, after "oversized" insert -- chip carriers --.
Line 34, delete "occurrence" and insert therefor -- possibility --.
Line 50, delete "to the" and insert therefor -- in --.
Line 50, delete "not able" and insert therefor -- unable --.
Lines 51 and 53, delete "Pat." and insert therefor -- Patent --.
Line 54, delete "discloses a" and insert therefor -- disclose --.
Line 55, delete "package" and insert therefor -- packages --.
Line 55, after "having" delete "an".
Line 55, delete "chip" and insert therefor -- chips --.
Line 63, delete "do" and insert therefor -- does --.
Line 63, delete "factions or using" and insert therefor -- functions, or --.
Lane 64, delete "member" and insert therefor -- substrate --.

Column 2,
Line 2, delete "wires, so as to avoid" and insert therefor -- wires. This prevents --.
Line 2, delete "in contact with" and insert therefor -- from contacting and short-circuiting --.
Line 3, delete "placing" and insert therefor -- being placed --.
Line 4, after "apparatus 63" delete "which would otherwise cause shortage".
Line 5, after "provides" insert -- a --.
Line 7, delete "chip, so as to prevent" and insert therefor -- chip. This prevents --.
Line 8, after "chip 64" insert -- from --.
Line 9, delete "extending outwardly atop of" and insert therefor -- where the second chip 64 extends over --.
Line 10, delete "and eliminate shortage from occurrence" and insert therefor -- to prevent short circuits --.
Line 11, before "second" delete "size of the".

UNITED STATES PATENT AND TRADEMARK OFFICE
CERTIFICATE OF CORRECTION

PATENT NO. : 6,919,627 B2
DATED : July 19, 2005
INVENTOR(S) : Liu et al.

It is certified that error appears in the above-identified patent and that said Letters Patent is hereby corrected as shown below:

Column 2 (cont'd),
Line 11, delete "is not necessary" and insert therefor -- can --.
Line 11, after "be" delete "restricted and the size".
Line 12, delete "is also applicable to use, therefore largely improving the capability of forming integrated circuits with higher density" and insert therefor -- allowing higher density integrated circuits --.
Line 41, delete "The" and insert therefor -- Although the --.
Line 41, after "method" delete "although".
Line 44, delete "is" and insert therefor -- are --.
Line 45, delete "the final yield" and insert therefor -- it --.
Line 45, delete "enhanced" and insert therefor -- enhance the final yield --.
Line 45, delete "as" and insert therefor -- since --.
Line 46, delete "is required" and insert therefor -- need --.
Line 49, after "(i.e. the second chip)," delete "it is common that".
Line 51, delete "lead to the deviation" and insert therefor -- often lead to movement --.
Line 52, after "reliability" delete "concerns".
Line 53, after "product" insert -- was --.
Line 53, delete "exists." and insert therefor -- a concern. --.
Line 54, delete "Pat" and insert therefor -- Patent --.
Line 58, delete "contacting" and insert therefor -- contact --.
Line 59, after "method is" delete "substantially very".
Line 61, delete "apparatus. Firstly, forming" and insert therefor -- apparatus in forming --.
Line 63, after "opposing" delete "to".
Line 66, delete "then" and insert therefor -- The method includes --.

Column 3,
Line 3, delete "It is then followed by" and insert therefor -- The method includes --.
Line 6, after ""utilizes" insert -- a --.
Line 8, delete "applying" and insert therefor -- applies --.
Line 12, after "for" delete "to".
Line 15, delete "bonding, making" and insert therefor -- bonding. This makes --.
Line 22, after "chip," delete "a".
Line 38, delete "wires from accordance and" and insert therefor -- wires, which --.
Line 39, delete "enhancing" and insert therefor -- enhances --.
Line 51, delete "not" and insert therefor -- no --.
Line 58, after "which" delete "a method is proposed such that".
Line 60, after "eliminating" delete "the occurrence of".
Line 60, delete "shortage" and insert therefor -- short-circuits --.

Column 4,
Line 47, delete "solve" and insert therefor -- solves --.

UNITED STATES PATENT AND TRADEMARK OFFICE
CERTIFICATE OF CORRECTION

PATENT NO. : 6,919,627 B2
DATED : July 19, 2005
INVENTOR(S) : Liu et al.

It is certified that error appears in the above-identified patent and that said Letters Patent is hereby corrected as shown below:

Column 4 (cont'd),
Line 48, delete "arts" and insert therefor -- art --.
Line 49, delete "and" and insert therefor -- where --.
Line 56, delete "technique" and insert therefor -- techniques --.
Line 56, after "(approx. 4 mils)" insert a comma.
Line 63, delete "shortage" and insert therefor -- short-circuits --.

Column 5,
Line 6, delete "which in tern preventing deviation" and insert therefor -- which, in turn prevents movement --.
Line 11, before "heat-retaining" insert -- a --.
Line 25, delete "FIGS. 3A-3F" and insert -- FIGs. 3A-3F --.
Lines 38, 42 and 46, delete "Pat," and insert therefor -- Patent --.
Line 53, delete "FIGS." and insert therefor -- FIGs. --.

Column 6,
Line 22, delete "side" and insert therefor -- sides --.
Line 39, delete "surface 111" and insert therefor -- surface 110 --.

Column 7,
Line 9, delete "Pat." and insert therefor -- Patent --.
Line 28, delete "FIGS." and insert therefor -- FIGs. --.
Line 28, delete "Referring to FIGS. 3A and 3B, the first step is to prepare a substrate 10 having a predetermined chip attachment region and then dispensing silver paste on the chip attachment region using conventional stamping or globing technique allowing the first chip 11 to be adhered thereon." and insert therefor -- Referring to FIGs. 3A and 3B, the first step is to prepare a substrate 10 having a predetermined chip attachment region and then dispensing silver paste on the chip attachment region using conventional stamping or globbing technique allowing the first chip 11 to be adhered thereon. --.

Column 8,
Line 37, delete "in that," and insert therefor -- that --.
Line 38, delete "is by utilizing" and insert therefor -- utilizes --.
Line 39, delete "technique; that is" and insert therefor -- technique. The reverse bonding technique involves --.
Line 45, before "reverse" insert -- the --.
Line 48, after "used" delete ", so as".
Line 49, delete "reducing" and insert therefor -- reduces --.
Line 57, delete "in that," and insert therefor -- that the space --.
Line 59, delete "43, including that" and insert therefor -- 43. The --.

UNITED STATES PATENT AND TRADEMARK OFFICE
CERTIFICATE OF CORRECTION

PATENT NO. : 6,919,627 B2
DATED : July 19, 2005
INVENTOR(S) : Liu et al.

It is certified that error appears in the above-identified patent and that said Letters Patent is hereby corrected as shown below:

Column 8 (cont'd),
Line 60, delete "therein, however" and insert therefor -- in the adhesive 43. However, --.
Line 61, delete "become" and insert therefor -- becoming --.
Line 62, after "thick," insert -- the --.
Line 62, delete "applied" and insert therefor -- used --.
Line 64, after "Moreover," delete "as".
Line 65, delete "is consisted" and insert therefor -- consists --.
Line 67, delete "surface, the occurrence of shortage" and insert therefor -- surface. This eliminates the --.

Column 9,
Line 1, delete "cannot be made possible," and insert therefor -- possibility of short-circuits, --.
Line 4, after "adhesive 43" delete "is".
Line 4, delete "filled" and insert therefor -- fills the space --.
Line 7, delete "occurrence," and insert therefor -- occurring, --.
Line 8, delete "eliminating" and insert therefor -- eliminates --.
Line 9, after "during the" delete "latter".
Line 18, after "difference" delete "in".
Line 18, after "that" delete the comma.
Line 19, delete "50, thus both one" and insert therefor -- 50. Thus both --.
Line 22, delete "eclectically" and insert therefor -- electrically --.

Signed and Sealed this

Eighth Day of November, 2005

JON W. DUDAS
*Director of the United States Patent and Trademark Office*